US009349322B2

(12) United States Patent
Kim et al.

(10) Patent No.: US 9,349,322 B2
(45) Date of Patent: May 24, 2016

(54) POWER SHARING LINES FOR POWERING A SMALL FORM FACTOR OLED DISPLAY DEVICE

(71) Applicant: LG Display Co., Ltd., Seoul (KR)

(72) Inventors: Nak Woo Kim, Paju-si (KR); Hee Kwang Kang, Goyang-si (KR); Dae Sung Jung, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/806,925

(22) Filed: Jul. 23, 2015

(65) Prior Publication Data

US 2016/0027380 A1    Jan. 28, 2016

(30) Foreign Application Priority Data

Jul. 24, 2014    (KR) .......................... 10-2014-0094296

(51) Int. Cl.
    *G09G 5/00*        (2006.01)
    *G09G 3/32*        (2016.01)
(52) U.S. Cl.
    CPC ...... *G09G 3/3258* (2013.01); *G09G 2300/0408* (2013.01); *G09G 2300/0413* (2013.01); *G09G 2300/0426* (2013.01); *G09G 2300/0809* (2013.01)
(58) Field of Classification Search
    CPC ........... G06F 3/016; G06F 3/038; G06F 1/18; G06F 1/189; G09G 3/3258; G09G 3/3208; G09G 3/3233
    USPC ....................................... 379/433.1; 345/156
    See application file for complete search history.

(56) References Cited

U.S. PATENT DOCUMENTS

| | | | | |
|---|---|---|---|---|
| 6,525,997 | B1 * | 2/2003 | Narayanaswami | G04G 9/0082 368/223 |
| 8,193,031 | B2 * | 6/2012 | Hosoba | H01L 21/02554 257/E21.09 |
| 2003/0151982 | A1 * | 8/2003 | Brewer | G04G 21/00 368/46 |
| 2004/0256996 | A1 | 12/2004 | Osame et al. | |
| 2005/0162353 | A1 * | 7/2005 | Kanda | G09G 3/3233 345/76 |
| 2006/0238463 | A1 | 10/2006 | Kim et al. | |
| 2008/0262932 | A1 * | 10/2008 | Wareham | G06Q 30/02 705/14.4 |
| 2009/0026932 | A1 * | 1/2009 | Kwak | H01L 27/3276 313/504 |

(Continued)

FOREIGN PATENT DOCUMENTS

| | | |
|---|---|---|
| EP | 1717789 A2 | 11/2006 |
| EP | 2194425 A2 | 6/2010 |

OTHER PUBLICATIONS

European Search Report for European Patent Application No. EP 15178332.1, Dec. 1, 2015, 9 pages.

*Primary Examiner* — Jason M Crawford
(74) *Attorney, Agent, or Firm* — Fenwick & West LLP

(57) ABSTRACT

An organic light emitting diode (OLED) display device includes a substrate including a circular arc portion and a driving circuit connecting portion connected to the top of the circular arc portion. A circular display area is formed in the circular arc portion. The display area includes a number of OLED pixels, where each OLED pixel connected to one of a number of power lines. A driving power supply line provides a driving voltage for the OLED pixels. The driving power supply line includes a circular shape and is formed around the display area. A number of power sharing lines extend from a lower area of the driving power supply line, where each of the power sharing lines is connected to a different subset of the power lines.

21 Claims, 8 Drawing Sheets

(56) References Cited

U.S. PATENT DOCUMENTS

| | | |
|---|---|---|
| 2009/0102758 A1 | 4/2009 | Anzai et al. |
| 2010/0134743 A1 | 6/2010 | Shin et al. |
| 2010/0289994 A1 | 11/2010 | Nonaka |
| 2011/0037095 A1* | 2/2011 | Park .................. H01L 51/525 257/100 |
| 2011/0291119 A1* | 12/2011 | Ryu .................. H01L 27/3276 257/88 |
| 2012/0314546 A1* | 12/2012 | Brewer .................. G04G 17/04 368/281 |
| 2014/0028596 A1* | 1/2014 | Seo .................. G06F 3/0487 345/173 |
| 2014/0139422 A1* | 5/2014 | Mistry .................. G06F 3/014 345/156 |
| 2014/0254139 A1* | 9/2014 | Park .................. G09G 3/20 362/97.1 |

* cited by examiner

POWER SHARING LINES FOR POWERING A SMALL FORM FACTOR OLED DISPLAY DEVICE

CROSS REFERENCE TO RELATED APPLICATIONS

This application claims the benefit of the Korean Patent Application No. 10-2014-0094296 filed on Jul. 24, 2014, which is hereby incorporated by reference for all purposes as if fully set forth herein.

BACKGROUND OF THE INVENTION

1. Field of the Invention

The present invention relates to a display device, and more particularly, to a display device having a circular display portion.

2. Discussion of the Related Art

Generally, display devices have been widely used as display screens of various products such as televisions, notebook computers and monitors as well as portable electronic devices such as mobile communication terminals, electronic diaries, electronic books, portable multimedia players (PMPs), navigation systems, ultra mobile PCs (UMPCs), mobile phones, smart phones, tablet PCs (personal computers) and watch phones.

Of the display devices, a liquid crystal display device, an organic light emitting display device and an Electrophoretic display device may be manufactured at slim sizes, whereby studies for developing these display devices as flexible display devices have been made.

A flexible display device based on an organic light emitting diode displays a desired picture image by controlling a current, which flows from a pixel power line to the organic light emitting diode, in accordance with a data signal. Such a flexible display device based on an organic light emitting diode has a rectangular type display portion on a plane due to an arrangement structure of a signal line, an arrangement structure of a pixel driving power line, and an arrangement structure of a driving circuit.

Recently, as importance in appearance and design of the display device has been considered and attention of consumers to wearable devices such as a watch phone has been increased, studies and developments of a display device having a circular display portion not a rectangular display portion have been made.

SUMMARY OF THE INVENTION

Accordingly, the present invention is directed to a display device that substantially obviates one or more problems due to limitations and disadvantages of the related art.

According to one embodiment, an organic light emitting diode (OLED) display device includes a substrate including a circular arc portion and a driving circuit connecting portion connected to the top of the circular arc portion. A circular display area is formed in the circular arc portion. The display area includes a number of OLED pixels, where each OLED pixel connected to one of a number of power lines. A driving power supply line provides a driving voltage for the OLED pixels. The driving power supply line includes a circular shape and is formed around the display area. A number of power sharing lines extend from a lower area of the driving power supply line, where each of the power sharing lines is connected to a different subset of the power lines.

According to one embodiment, an OLED display device includes a substrate including a driving circuit connecting portion formed on top of a circular portion. A display area is formed in the circular portion and includes a number of OLED pixels arranged in a circular shape. Each OLED pixel is physically connected to one of a number of power lines and is also physically connected to one of a number data lines. A driving circuit is formed in the driving circuit connecting portion that is electrically connected to the data lines and where a portion of each data line extends downwards towards its associated physically connected OLED pixels. A driving voltage pad is formed in the driving circuit connecting portion that is physically connected to a driving power supply line that extends downward and surrounds the OLED pixels. Each of the power lines is electrically coupled to the driving power supply line and extends upwards towards its associated physically connected OLED pixels.

An advantage of the present invention is to provide a display device having a thin bezel width while having a circular display portion.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the exemplary embodiments of the present invention, examples of which are illustrated in the accompanying drawings. Wherever possible, the same reference numbers will be used throughout the drawings to refer to the same or like parts.

Terms disclosed in this specification should be understood as follows.

The term of a singular expression should be understood to include a multiple expression as well as the singular expression if there is no specific definition in the context. The terms such as "the first" and "the second" are used only to differentiate one element from other elements. Thus, a scope of claims is not limited by these terms. Also, it should be understood that the term such as "include" or "have" does not preclude existence or possibility of one or more features, numbers, steps, operations, elements, parts or their combinations. It should be understood that the term "at least one" includes all combinations related with any one item. For example, "at least one among a first element, a second element and a third element" may include all combinations of two or more elements selected from the first, second and third elements as well as each element of the first, second and third elements. Also, if it is mentioned that a first element is positioned "on or above" a second element, it should be understood that the first and second elements may be brought into contact with each other, or a third element may be interposed between the first and second elements.

Hereinafter, a display device according to the preferred embodiment of the present invention will be described in detail with reference to the accompanying drawings. Wherever possible, the same reference numbers will be used throughout the drawings to refer to the same or like parts. Also, in the following description of the present invention, if detailed description of elements or functions known in respect of the present invention is determined to make the subject matter of the present invention unnecessarily obscure, the detailed description will be omitted.

Figure 1:
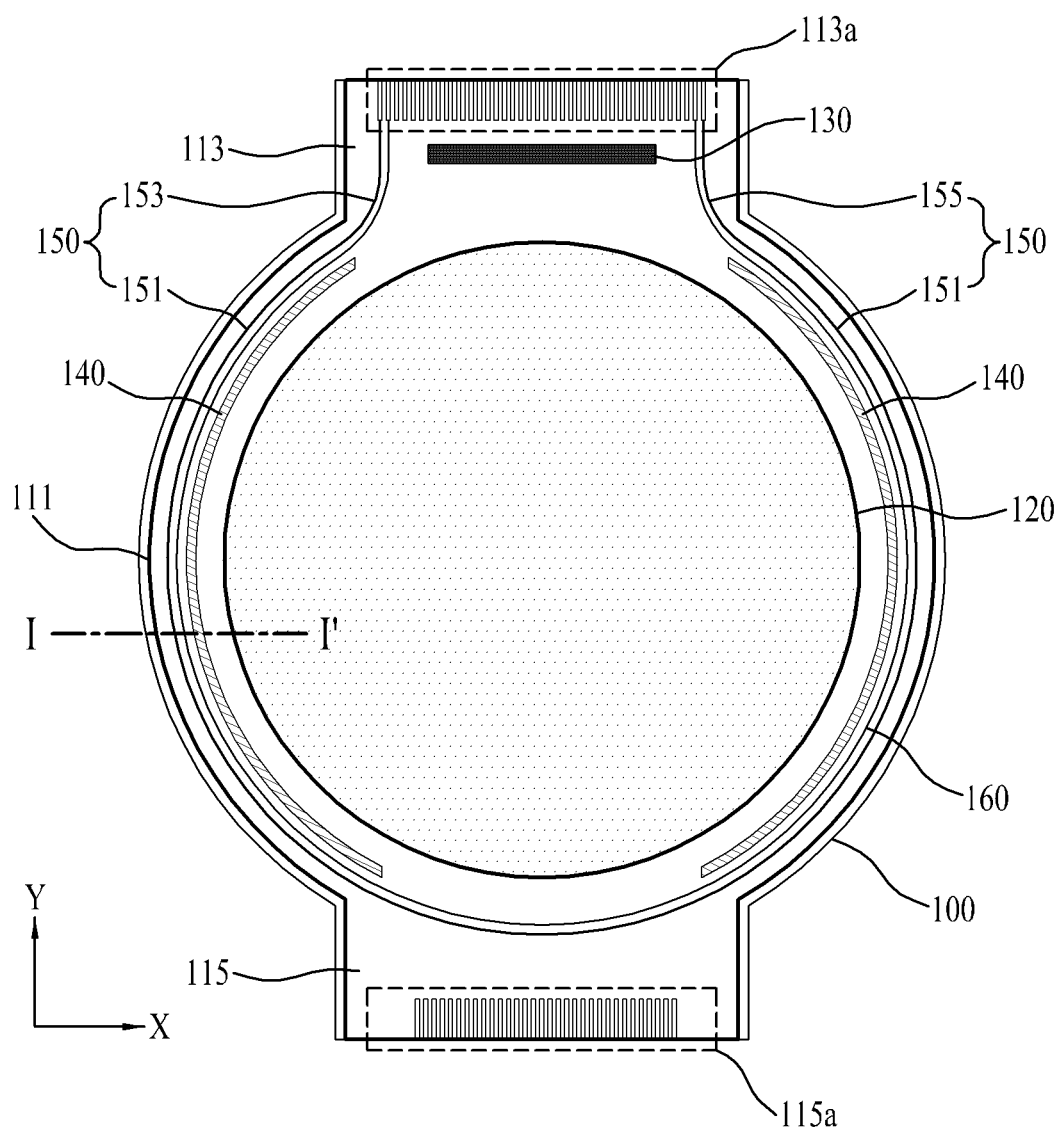
FIG. 1 is a plane view briefly illustrating a display device according to one embodiment of the present invention.
Figure 2:
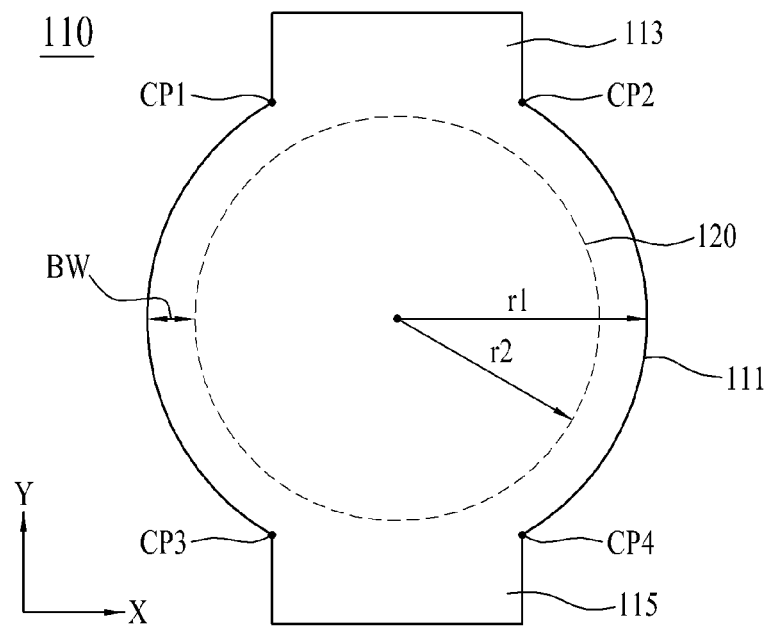
FIG. 2 is a plane view illustrating a substrate and a circular display portion, which are shown in FIG. 1.
Figure 3:
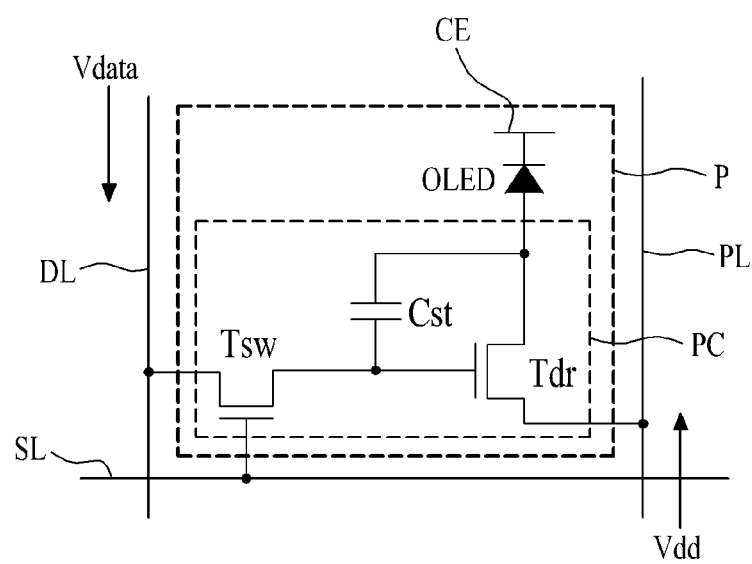
FIG. 3 is a circuit view of a pixel formed in a circular display portion shown in FIG. 1.
Figure 4:
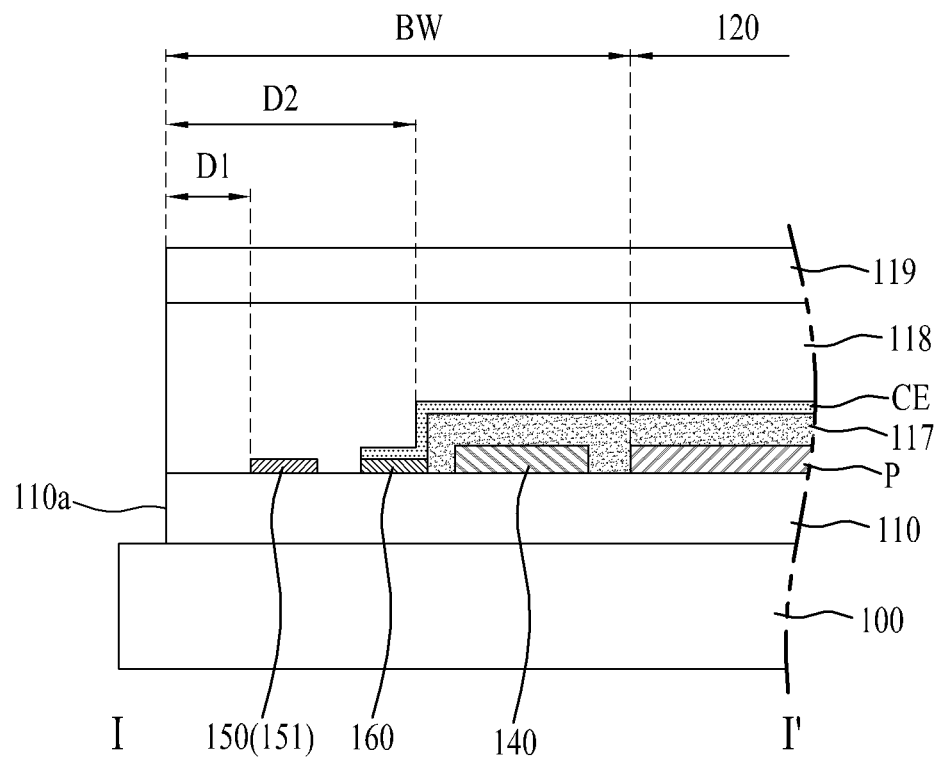
FIG. 4 is a cross-sectional view taken along line I-I' shown in FIG. 1.

FIG. 1 is a plane view briefly illustrating a display device according to one embodiment of the present invention, FIG. 2 is a plane view illustrating a substrate and a circular display portion, which are shown in FIG. 1, FIG. 3 is a circuit view of a pixel formed in a circular display portion shown in FIG. 1, and FIG. 4 is a cross-sectional view taken along line IT shown in FIG. 1.

Referring to FIGS. 1 to 4, the display device according to one embodiment of the present invention includes a substrate 110, a circular display portion 120, a driving circuit portion 130, a driving power supply line 150, and a cathode power supply line 160.

The substrate 110 may include a circular arc portion 111 and a driving circuit connecting portion 113, and its example may include a flexible substrate, for example, a plastic substrate.

The circular arc portion 111 is formed in a shape of a circular arc by first and second circumference points CP1 and CP2, each of which has the same first radius r1 based on a center portion of the circular display portion 120, wherein the first and second circumference points CP1 and CP2 are connected with each other in a straight line.

The driving circuit connecting portion 113 is projected (or extended) from one side of the circular arc portion 111 defined between the first and second circumference points CP1 and CP2, to have a certain size. The driving circuit connecting portion 113 may include the driving circuit portion 130 connected with the circular display portion 120, various link lines, and a driving pad portion 113a. The driving circuit connecting portion 113 is connected with a display driving portion (not shown) of the display device through the driving pad portion 113a. The driving pad portion 113a may include a plurality of data pads to which image data for displaying images on the circular display portion 120 are supplied from the display driving portion, a plurality of power pads to which a power source required for driving of a pixel P is supplied, and a plurality of control signal pads to which a control signal is supplied.

The substrate 110 may further include a touch circuit connecting portion 115. The touch circuit connecting portion 115 is projected (or extended) from the other side of the circular arc portion 111 defined between third and fourth circumference points CP3 and CP4 having the same first radius r1 based on the center portion of the circular display portion 120, to have a certain size. The touch circuit connecting portion 115 may include a touch driving line of a touch panel (not shown) arranged on the circular display portion 120, a routing line connected to a touch sensing line, and a touch pad portion 115a. The touch circuit connecting portion 115 is connected with a touch driving portion (not shown) of the display device through the touch pad portion 115a. The touch pad portion 115a may include a plurality of driving line pads connected to the touch driving line, and a plurality of sensing line pads connected to the touch sensing line.

The substrate 110 may be attached onto a support substrate 100. That is, the support substrate 100 is formed in the same shape as that of the substrate 110, and maintains the substrate 110 made of a flexible material in a plane state. In this case, if the substrate 110 is made of a non-flexible material, it is preferable that the support substrate 100 is omitted for slimming of the display device.

The circular display portion 120 is formed on the circular arc portion 111 of the substrate 110 in a shape of a circle. That is, the circular display portion 120 is formed in a shape of a circle having a second radius r2 smaller than the first radius r1, based on the center portion. At this time, the circular arc portion 111 and the circular display portion 120 are substantially formed in a shape of a concentric circle, whereby a bezel width BW of the display device, which is defined between an outer sidewall of the substrate 110 and the circular display portion 120, may be reduced.

The circular display portion 120 includes a display area comprising a plurality of pixels P, and a circular non-display area surrounding the display area.

The display area includes a plurality of scan lines SL having regular intervals, a plurality of data lines DL having regular intervals while crossing the plurality of scan lines SL, a plurality of pixel power lines PL parallel with the plurality of data lines DL, and the plurality of pixels P.

Figure 6:
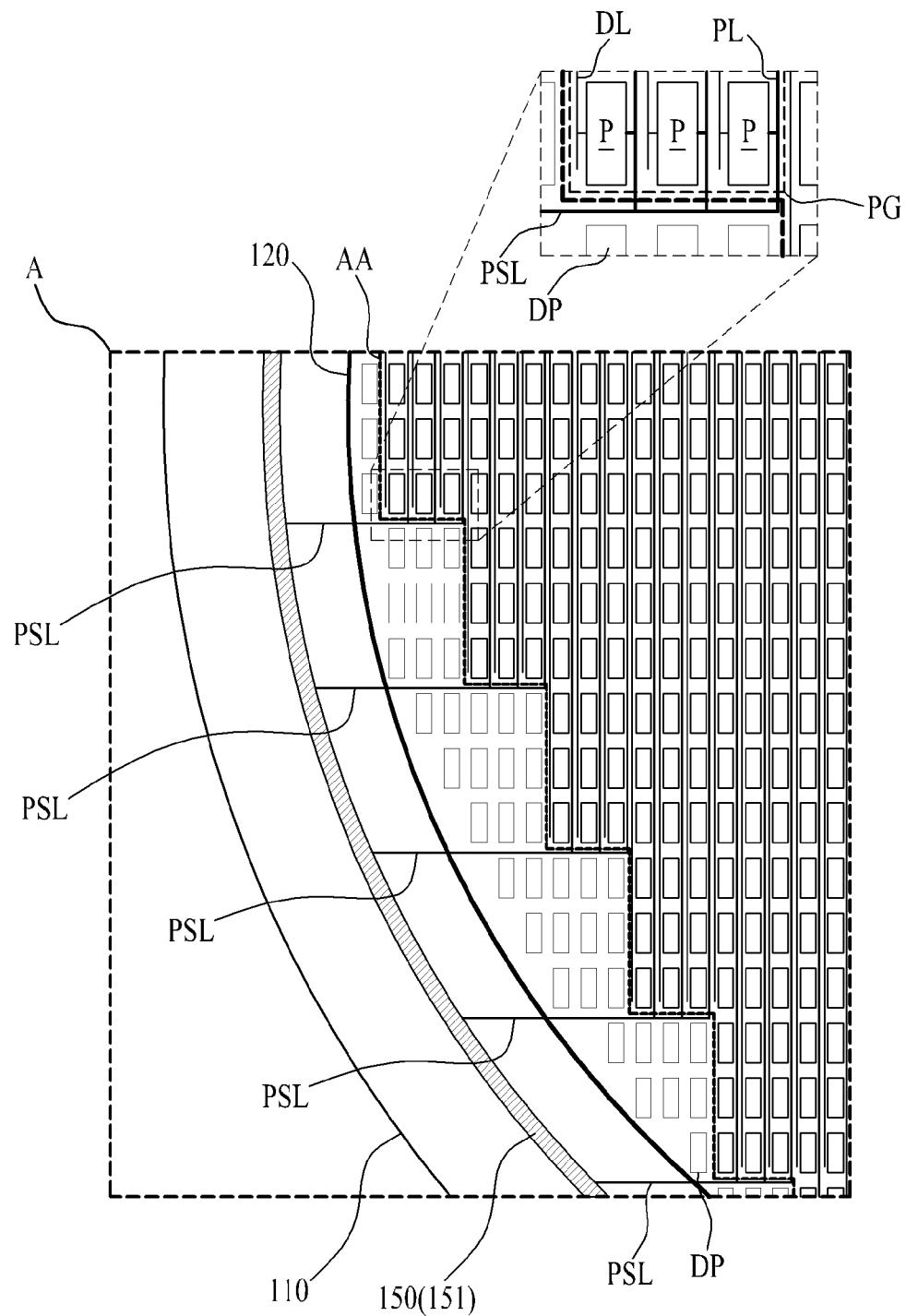
FIG. 6 is an enlarged view of a portion "A" shown in FIG. 5.

Each of the plurality of pixels P is arranged in the display area (see FIG. 6; AA) to have a matrix arrangement. At this time, the pixels adjacent to the non-display area may be arranged in a shape of a stair (see FIG. 6) in accordance with a circumference of the circular non-display area. That is, since rectangular pixels are arranged along a circumference of the display area to form the circular display portion 120, the circumference of the display area is substantially formed in a shape of a stair not a circle due to the rectangular pixels. However, if the circular display portion 120 has resolution more than a certain level, since the circumference of the display area is perceived in a shape of a circle, the circumference of the display area comprised of a fine stair shape by pixel arrangement may be regarded as a circle shape. For this reason, it may be regarded that the arc portion 111 and the circular display portion 120 are substantially formed in a shape of a concentric circle. Additionally, dummy pixels (see FIG. 6; DP) may be formed at a boundary portion of the display area and the circular non-display area along the circumference of the display area. The dummy pixels may serve to prevent actual pixels P for displaying images from being damaged by external static electricity. At this time, the same number of dummy pixels or one or more dummy pixels may be formed at both ends of each pixel row formed in the display area, and the same number of dummy pixels or different number of dummy pixels may be formed in each pixel row along the circumference of the display area. Each of the plurality of pixels P may include a pixel circuit (PC) and an organic light emitting diode (OLED).

The pixel circuit PC is connected to its adjacent scan line SL, data line DL and pixel power line PL, and controls a current flowing in the organic light emitting diode OLED in accordance with a data signal Vdata from the data line DL in response to a scan pulse from the scan line SL. The pixel circuit PC according to one embodiment may include a switching transistor Tsw, a driving transistor Tdr, and a capacitor Cst.

The switching transistor Tsw is switched in accordance with the scan pulse supplied to the scan line SL, and supplies the data signal Vdata, which is supplied to the data line DL, to the driving transistor Tdr. The driving transistor Tdr is switched in accordance with the data signal Vdata supplied from the switching transistor Tsw and controls a data current flowing in the organic light emitting diode OLED from the pixel power line PL. The capacitor Cst is connected between a gate terminal and a source terminal of the driving transistor Tdr to store a voltage corresponding to the data signal Vdata supplied to the gate terminal of the driving transistor Tdr, and turns on the driving transistor Tdr by the stored voltage.

The organic light emitting diode OLED may include an anode electrode (or pixel electrode) connected to the source terminal of the driving transistor Tdr, an organic light emitting layer formed on the anode electrode, and a cathode electrode layer CE formed on the organic light emitting layer. The organic light emitting diode OLED displays a predetermined image by emitting light in accordance with the data current supplied from the driving transistor Tdr.

The driving circuit portion 130 according to the first embodiment displays a predetermined image on the circular display portion 120 by driving the plurality of pixels formed in the circular display portion 120 by using image data, a control signal, and a driving voltage, which are supplied from the display driving portion through the driving pad portion 113a. The driving circuit portion 130 according to the first embodiment is comprised of an integrated circuit, is packaged in a chip package area provided in the driving circuit connecting portion 113, and is connected to the plurality of scan lines and the plurality of data lines through link lines formed between the chip package area and the circular display portion 120, whereby the data signal Vdata is supplied to the plurality of data lines DL to synchronize with supply of the scan pulse to the plurality of scan lines SL. That is, the driving circuit portion 130 according to the first embodiment converts image data to analog type data signal Vdata in response to the control signal and generates the scan pulse, and supplies the data signal Vdata to the plurality of data lines DL to synchronize with sequential supply of the generated scan pulse to the plurality of scan lines SL. At this time, the driving circuit portion 130 generates pixel data per pixel by aligning the input image data to be suitable for the pixel arrangement structure of the circular display portion 120, and converts the generated pixel data to the data signal Vdata.

The driving circuit portion 130 according to the second embodiment supplies the data signal Vdata to the plurality of data lines DL formed in the circular display portion 120 by using image data, a control signal, and a driving voltage, which are supplied from the display driving portion through the driving pad portion 113a. The driving circuit portion 130 according to the second embodiment is comprised of an integrated circuit, is packaged in the chip package area provided in the driving circuit connecting portion 113, and is connected to the plurality of data lines through data link lines formed between the chip package area and the circular display portion 120, whereby the data signal Vdata is supplied to the plurality of data lines DL. That is, the driving circuit portion 130 according to the second embodiment generates pixel data per pixel by aligning image data input in response to the control signal to be suitable for the pixel arrangement structure of the circular display portion 120, converts the generated pixel data to the data signal Vdata, and supplies the converted data signal to the plurality of data lines DL.

If the display device according to the present invention includes the driving circuit portion 130 according to the second embodiment, the display device according to the present invention further includes a scan driving circuit 140 formed on the circular arc portion 111 of the substrate 110 along the circumference of the circular display portion 120 instead of omitting a plurality of scan link lines formed in the driving circuit connecting portion 113 to connect a scan channel of the driving circuit portion 130 with the plurality of scan lines SL one to one.

The scan driving circuit 140 is formed in a shape of a circular arc along the circumference of the circular display portion 120 and then connected to the plurality of scan lines SL. The scan driving circuit 140 generates scan pulses in response to a scan control signal supplied from the display driving portion through scan control link lines and the driving pad portion 130a and sequentially supplies the generated scan pulses to the plurality of scan lines SL. As one example, the scan driving circuit 140 may be formed along a left circumference or right circumference of the circular display portion 120 and may supply the scan pulses to one end or the other end of each of the plurality of scan lines SL. As another example, the scan driving circuit 140 may be formed along the left circumference or right circumference of the circular display portion 120 and may simultaneously supply the scan pulses to one end and the other end of each of the plurality of scan lines SL. As another example, the scan driving circuit 140 may be formed along the left circumference or right circumference of the circular display portion 120, and may supply the scan pulses to one end of the odd numbered scan lines SL and supply the scan pulses to the other end of the even numbered scan lines SL.

If the display device according to the present invention includes the scan driving circuit 140, the present invention may reduce the bezel width BW of the display device by reducing a size of the driving circuit connecting portion 113 in accordance with omission of the plurality of scan link lines or reducing a length between the first and second circumference points CP1 and CP2, and the circular arc portion 111 may be formed in a shape of a concentric circle together with the circular display portion 120. Alternatively, the present invention may arrange or form the plurality of data link lines in the driving circuit connecting portion 113 more sufficiently by obtaining a space for forming the data link lines as much as a space reserved by the plurality of scan link lines which are omitted, instead of reducing the bezel width BW of the display device.

The driving power supply line 150 is formed on the substrate 110 along the circumference of the circular display portion 120 to have a constant width and thickness, and each of its ends is connected to an associated driving power pad of the driving pad portion 113a formed in the driving circuit connecting portion 113. The driving power supply line 150 serves as a main power line for supplying a pixel driving power source Vdd supplied from the display driving portion through each of the driving power pads to the plurality of pixel power lines PL formed in the circular display portion 120.

The driving power supply line 150 according to one embodiment may be categorized into a circumference line 151, a first shoulder line 153 and a second shoulder line 155 in accordance with its position formed on the substrate 110.

The circumference line 151 is formed along the circumference of the other circular display portion 120 except one side of the circular display portion 120 adjacent to the driving circuit connecting portion 113. Preferably, the circumference line 151 is formed in a shape of a concentric circle with at least one of the circular display portion 120 and an outer sidewall of the substrate 110. At this time, as shown in FIG. 4, since the driving power supply line 150 is formed at the outmost of the substrate 110, the driving power supply line 150 should be spaced apart from the outer sidewall 110a of the substrate 110 as much as a predetermined distance D1 by considering inflow of static electricity, etc. If the circumference line 151 is not formed in a shape of a concentric circle with the circular display portion 120, the distance D1 between the outer sidewall 110a of the substrate 110 and the circumference line 151 becomes non-uniform, whereby static electricity may be entered from the circumference line 151 arranged to be relatively close to the outer sidewall 110a of the substrate 110. Therefore, it is preferable that the circumference line 151 is formed in a shape of a concentric circle with the circular display portion 120, and is also formed in a shape of a concentric circle with the outer sidewall 110a of the substrate 110.

The first shoulder line 153 is formed between one side end of the circumference line 151 adjacent to the driving circuit connecting portion 113 and a first driving power pad of the driving pad portion 113a at a certain curvature and connects one side end of the circumference line 151 to the first driving power pad. The first shoulder line 153 is formed at a relatively great curvature to surround the first circumference point CP1 without being overlapped with the outmost link line formed between the driving circuit portion 130 and the circular display portion 120.

The second shoulder line 155 is formed between the other side end of the circumference line 151 adjacent to the driving circuit connecting portion 113 and a second driving power pad of the driving pad portion 113a at a certain curvature and connects the other side end of the circumference line 151 to the second driving power pad. The second shoulder line 155 is formed at a relatively great curvature to surround the second circumference point CP2 without being overlapped with the outmost link line formed between the driving circuit portion 130 and the circular display portion 120.

Voltage drop deviation generated in the driving power supply line 150 may be minimized as a same pixel driving power source Vdd is supplied to both ends of the circumference line 151 through each of the first and second shoulder lines 153 and 155.

The cathode power supply line 160 is formed on the substrate 110 between the driving power supply line 150 and the circular display portion 120 along the circumference of the circular display portion 120 to have a constant width and thickness, and its both ends are each connected to an associated cathode power pad of the driving pad portion 113a, each pad formed in the driving circuit connecting portion 113. The cathode power supply line 160 according to one embodiment may be formed in parallel with the driving power supply line 150 while having the same structure as that of the driving power supply line 150. The cathode power supply line 160 is electrically connected with a cathode electrode (CE) layer formed on the circular arc portion 111 to cover the circular display portion 120 as shown in FIG. 4. The cathode power supply line 160 supplies a cathode power, which is supplied from the display driving portion through each of the cathode power pads, to the cathode electrode (CE) layer, whereby the cathode power is supplied to the organic light emitting diode OLED of every pixel P formed in the circular display portion 120 through the cathode electrode layer.

The cathode electrode layer CE is formed on a passivation layer 117 for covering a transistor of each pixel P, and is electrically connected to the organic light emitting layer of the organic light emitting diode OLED formed in each pixel P. A corner portion of the cathode electrode layer CE is directly connected to the cathode power supply line 160.

The cathode electrode layer CE is formed between the driving power supply line 150 and the circular display portion 120, whereby the bezel width BW of the display device according to the present invention may be reduced. In more detail, since the passivation layer 117 for covering the transistor of each pixel P is made of an organic material for enabling active water permeation, the passivation layer 117 should be spaced apart from the outer sidewall 110a of the substrate 110 as much as a certain distance D2 to prevent the organic light emitting diode OLED from being damaged by water permeated into the passivation layer 117. Therefore, in the present invention, the cathode electrode layer CE is formed between the driving power supply line 150 and the circular display portion 120 such that the cathode electrode layer CE may be spaced apart from the outer sidewall 110a of the substrate 110 as much as a certain distance D2, whereby the passivation layer 117 may be spaced apart from the outer sidewall 110a of the substrate 110 as much as the certain distance D2, and at the same time the bezel width BW of the display device, which is defined by a width between the outer sidewall 110a of the substrate 110 and the circular display portion 120, may be reduced.

Meanwhile, the cathode electrode layer CE may be formed to be more adjacent to the outer sidewall 110a of the substrate 110 than the driving power supply line 150. However, in this case, the corner portion of the substrate 110 should be extended toward the outskirts to space the passivation layer 117 apart from the outer sidewall 110a of the substrate 110 as much as the certain distance D2, whereby a problem occurs in that the bezel width BW of the display device is increased.

As a result, in order to reduce the bezel width BW of the display device and at the same time space the passivation layer 117 apart from the outer sidewall 110a of the substrate 110 as much as the certain distance D2, it is preferable that the cathode electrode layer CE is formed between the driving power supply line 150 and the circular display portion 120.

Additionally, as shown in FIG. 4, the display device according to one embodiment of the present invention may further include an encapsulation layer 118 formed on the substrate 110 to cover the cathode electrode layer CE, and a barrier substrate 119 formed on the encapsulation layer 118.

The encapsulation layer 118 may be formed in a multi-layered structure that an organic material layer or an inorganic material layer, the organic material layer and the inorganic material layer are deposited alternately.

The barrier substrate 119 may be made of a material having low water permeability, for example, polymer material, and may be attached onto the encapsulation layer 118 by a transparent adhesive. A touch panel is attached onto the barrier substrate 119, and a polarizing film may additionally be attached onto the touch panel.

In the display device according to one embodiment of the present invention, the circular arc portion 111 of the substrate 110 and the circular display portion 120 are formed in a shape of a concentric circle, whereby the display device may have a thin bezel width BW while having the circular display portion 120. Also, in the display device according to one embodiment of the present invention, the driving power supply line 150 is formed along the circumference of the circular display portion 120 and also the cathode power line 160 is formed between the driving power supply line 150 and the circular display portion 120, whereby picture quality deterioration caused by voltage drop deviation per position of the driving power supply line 150 may be solved, reliability deterioration of the pixel P, which is caused by water permeation, may be avoided, and a thinner bezel width BW may be obtained together with the circular display portion 120.

Figure 5:
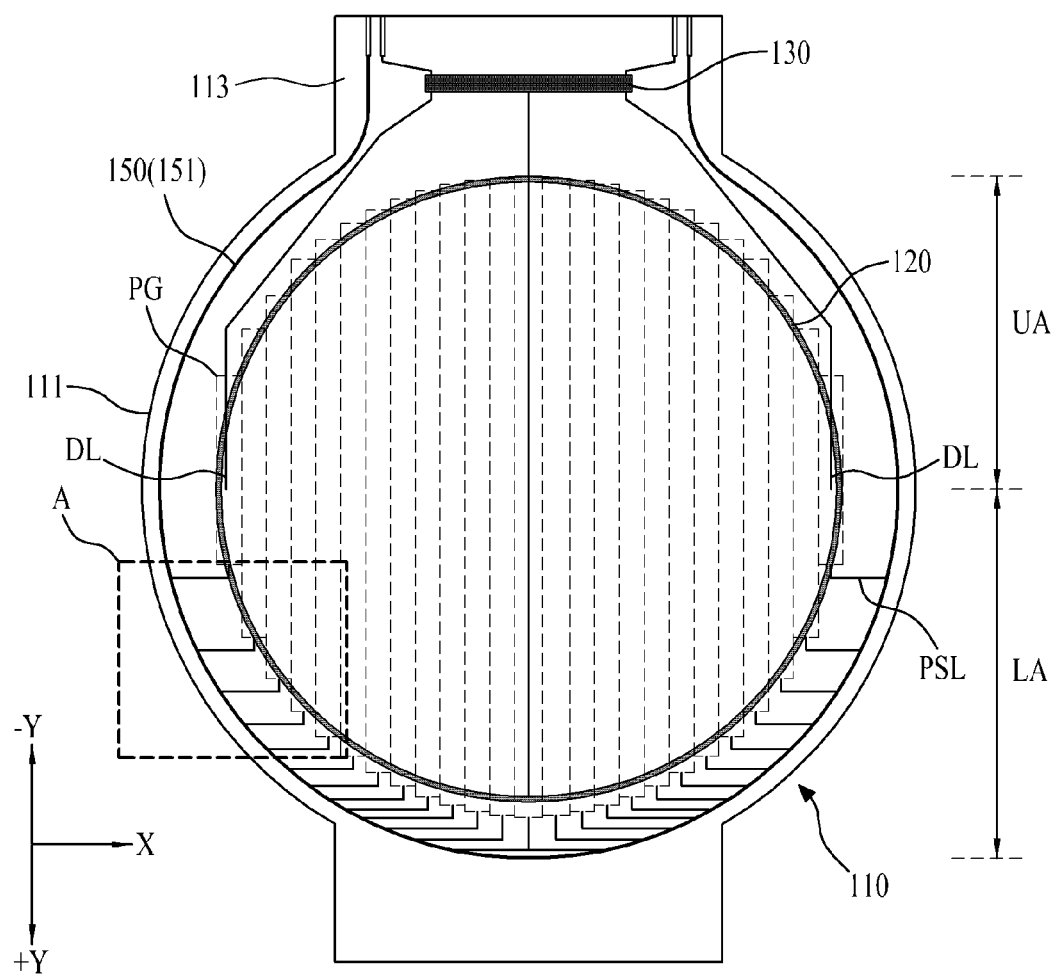
FIG. 5 is a view illustrating a connection structure between a driving power supply line and a pixel, which are shown in FIG. 1.

FIG. 5 is a view illustrating a connection structure between a driving power supply line and a pixel, which are shown in FIG. 1, and FIG. 6 is an enlarged view of a portion "A" shown in FIG. 5.

Referring to FIGS. 5 and 6 in connection with FIG. 1, first of all, a supply direction of the data signal Vdata supplied to each pixel P may be opposite to a supply direction of the pixel driving power source Vdd supplied to each pixel P. That is, the supply direction (+Y) of the data signal Vdata may be a first direction (+Y) oriented from one side of the circular display portion 120 to the other side. In contrast, the supply direction (−Y) of the pixel driving power source Vdd may be a second direction (−Y) oriented from the other side of the circular display portion 120 to one side in opposite to the first direction. To this end, the display device according to the present invention further includes a plurality of power sharing lines PSL.

The plurality of power sharing lines PSL according to the one embodiment electrically connect each of the plurality of pixel power lines PL to the circumference line 151 of the driving power supply line 150. Each of the power sharing lines PSL may extend outward away from the circumference line 151 in parallel with the scan line between the adjacent pixels along the longitudinal direction Y of the data lines DL and may be directly physically connected to a plurality of pixel power lines PL. Each PSL is connected one or more the pixel power lines PL based on the curvature of the circular display portion 120. Each power line is oriented perpendicularly to the initial portion of each PSL extending outward from the circumference line 151. At this time, it is preferable that each of the power sharing lines PSL is formed so as not to cross the data line to avoid signal interference between the pixel driving power source Vdd and the data signal Vdata.

Therefore, each of the power sharing lines PSL according to the one embodiment allows the pixel driving power source Vdd to be supplied along the direction (−Y) opposite to the supply direction (+Y) of the data signal Vdata by supplying the pixel driving power source Vdd supplied to the driving power supply line 150 to a lower end of each of the plurality of pixel power lines PL. As a result, the present invention may resolve picture quality deterioration or luminance non-uniformity, which is caused by deviation of the data signal Vdata based on resistance of the data line DL per position of each pixel P and deviation of the pixel driving power source Vdd based on resistance of the pixel power line PL.

For example, in a middle pixel (hereinafter, referred to as "first middle pixel") of the first horizontal line and a middle pixel (hereinafter, referred to as "second middle pixel") of the last horizontal line, if the supply direction of the data signal Vdata and the supply direction of the pixel driving power source Vdd are the same as each other, voltage drop of each of the data signal Vdata and the pixel driving power source Vdd occurs more frequently in the second middle pixel than the first middle pixel, whereby luminance deviation between the first and second middle pixels occurs even in case of the same data signal Vdata. In contrast, if the supply direction of the data signal Vdata and the supply direction of the pixel driving power source Vdd are opposite to each other, voltage drop of the data signal Vdata occurs more frequently in the second middle pixel than the first middle pixel, and voltage drop of the pixel driving power source Vdd occurs more frequently in the first middle pixel than the second middle pixel, whereby deviation of the data signal Vdata and deviation of the pixel driving power source Vdd may mutually be compensated and as a result luminance deviation between the first and second middle pixels may be minimized for the same data signal Vdata.

Each of the plurality of power sharing lines PSL according to another embodiment individually connects a plurality of pixel groups PG comprised of two or more pixels P to the circumference line 151 of the driving power supply line 150. That is, each of the plurality of power sharing lines PSL is formed to be shared by two or more pixel power lines PL included in each pixel group PG without crossing the data line to avoid signal interference between the pixel driving power source Vdd and the data signal Vdata. FIG. 6 illustrates an example implementation where each PSL is shared by three PLs, however in other implementations (not shown) each PSL may be shared between two, four, five, six, seven, or more PLs. In this case, each of the plurality of pixel groups PG may be comprised of two or more pixel rows of the pixel P directly physically connected to the data line DL and the pixel power line PL, wherein the pixel rows are set previously based on the curvature of the circular display portion 120 and may be the same as or different from one another. Additionally, at least one dummy pixel DP may be included in the pixel rows, which are included in each of the plurality of pixel groups PG, by the curvature of the circular display portion 120.

Each of the plurality of power sharing lines PSL according to still another embodiment is formed in parallel with the scan line to adjoin a lower portion of each pixel group PG, and is commonly connected to the pixel power line PL included in the corresponding pixel group PG. The driving power supply line 150, the plurality of power sharing lines PSL and the pixel power line PL may be formed on the same layer on the substrate 110. Each of the plurality of power sharing lines PSL according to still another embodiment commonly supplies the pixel driving power source Vdd, which is supplied to the driving power supply line 150, to the lower end of the pixel power lines PL included in the corresponding pixel group PG in a unit of each pixel group PG, whereby the pixel driving power source Vdd is supplied in the direction (−Y) opposite to the supply direction (+Y) of the data signal Vdata. As a result, as described above, the present invention may resolve picture quality deterioration or luminance non-uniformity, which is caused by deviation of the data signal Vdata based on resistance of the data line DL per position of each pixel P and deviation of the pixel driving power source Vdd based on resistance of the pixel power line PL.

As described above, each of the plurality of power sharing lines PSL according to the present invention may be formed at a lower area LA of the circular arc portion 111 along the circumference of the circular display portion 120 to supply the pixel driving power source Vdd to the lower end of the pixel power lines PL without crossing the data line. That is, the circular arc portion 111 of the substrate 110 has an upper area UA defined between the center portion of the circular display portion 120 and one side of the circular display portion 120 and the lower area LA defined between the center portion of the circular display portion 120 and the other side of the circular display portion 120. Therefore, according to the present invention, the data link lines for connecting the driving circuit portion 130 with the plurality of data lines DL may be formed at the upper area UA of the circular arc portion 111 adjacent to the circumference of the circular display portion 120 and the plurality of power sharing lines PSL may be formed at the lower area LA of the circular arc portion 111 adjacent to the circumference of the circular display portion 120, whereby the formation area of the data link lines may spatially be spaced apart from the formation area of the power sharing lines PSL. As a result, the length between the first and second circumference points CP1 and CP2 may be reduced by obtaining the formation area of the data link lines, and thus the circular arc portion 111 of the substrate 110 may be formed in a concentric circle with the circular display portion 120, whereby the bezel width BW of the display device may be reduced.

Figure 7:
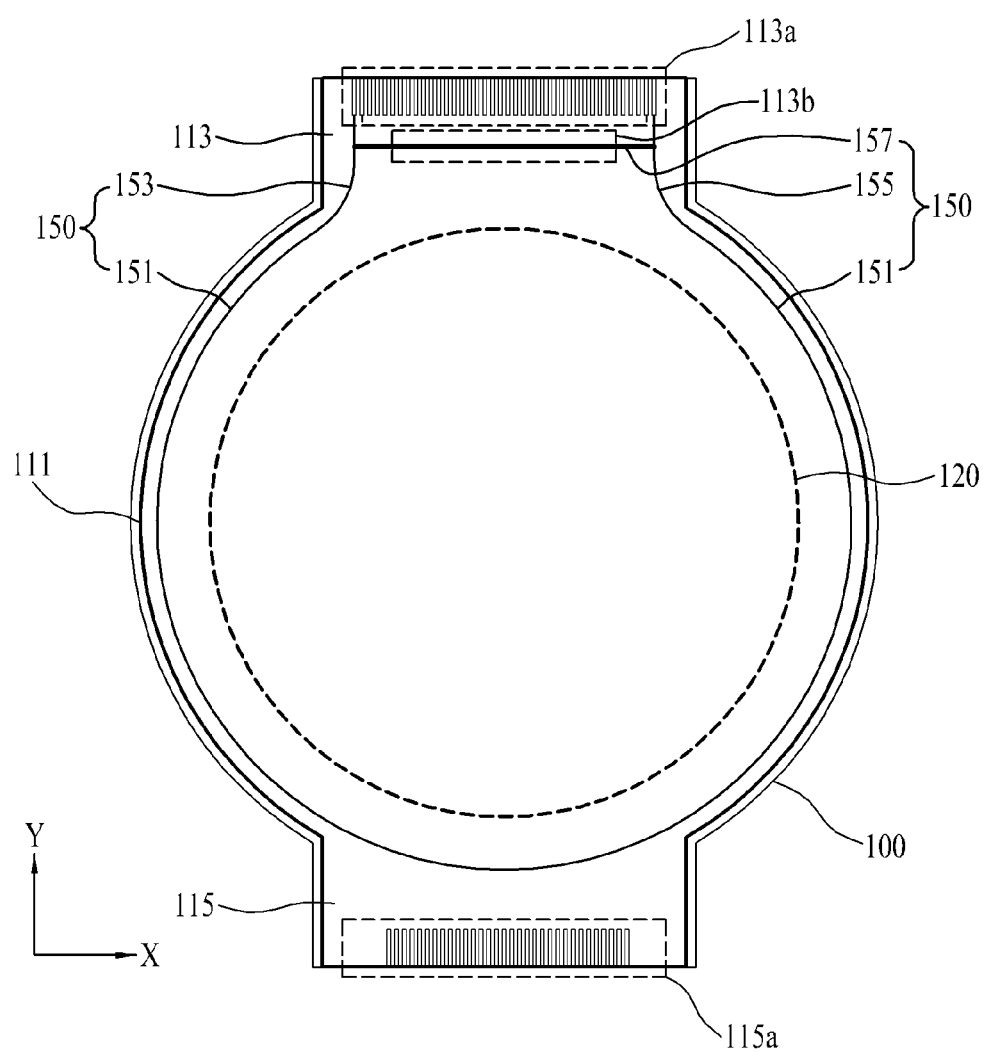
FIG. 7 is a view illustrating a modified example of a driving power supply line shown in FIG. 1.

FIG. 7 is a view illustrating a modified example of a driving power supply line shown in FIG. 1. In FIG. 7, a connection line is additionally formed. Therefore, in FIG. 7, a repeated description of elements corresponding to the same reference numerals as those of FIG. 1 will be omitted, and the driving power supply line will only be described hereinafter.

As shown in FIG. 7, the driving power supply line 150 may include a circumference line 151, first and second shoulder lines 153 and 155, and a connection line 157.

Since the circumference line 151 and the first and second shoulder lines 153 and 155 are the same as those described with reference to FIGS. 1 to 6, their repeated description will be omitted.

The connection line 157 is formed on the driving circuit connecting portion 113 and electrically connects the first and second shoulder lines 153 and 155 with each other, whereby the driving power supply line 150 is formed on the substrate 110 in a closed loop type. The connection line 157 according to one example is formed at a driving circuit formation area 113b defined on the driving circuit connecting portion 113 to form the driving circuit portion 130 (see FIG. 1), whereby one end of the connection line 157 is electrically connected to the first shoulder line 153 and the other end of the connection line 157 is electrically connected to the second shoulder line 155. Since the connection line 157 is formed at the driving circuit portion 130 (see FIG. 1), and more specifically underneath a driving integrated circuit (not shown) formed within portion 130. As a result, the connection line 157 does not overlap the data link lines formed in the driving circuit connecting portion 113 and does not affect the formation of the data link lines.

Additionally, the driving power supply line 150 formed by the connection line 157 in a closed loop type may be supplied with the pixel driving power source Vdd from the display driving portion through one driving power pad connected to a middle portion of the connection line 157 instead of the aforementioned first and second driving power pads. In this case, the number of the driving power pads formed in the driving pad portion 113a may be reduced.

Therefore, according to the present invention, the pixel driving power source Vdd is supplied to each pixel by using the driving power supply line 150 of the closed loop type to minimize voltage drop of the pixel driving power source Vdd, whereby picture quality deterioration caused by voltage drop of the pixel driving power source Vdd may be minimized or avoided.

Figure 8:
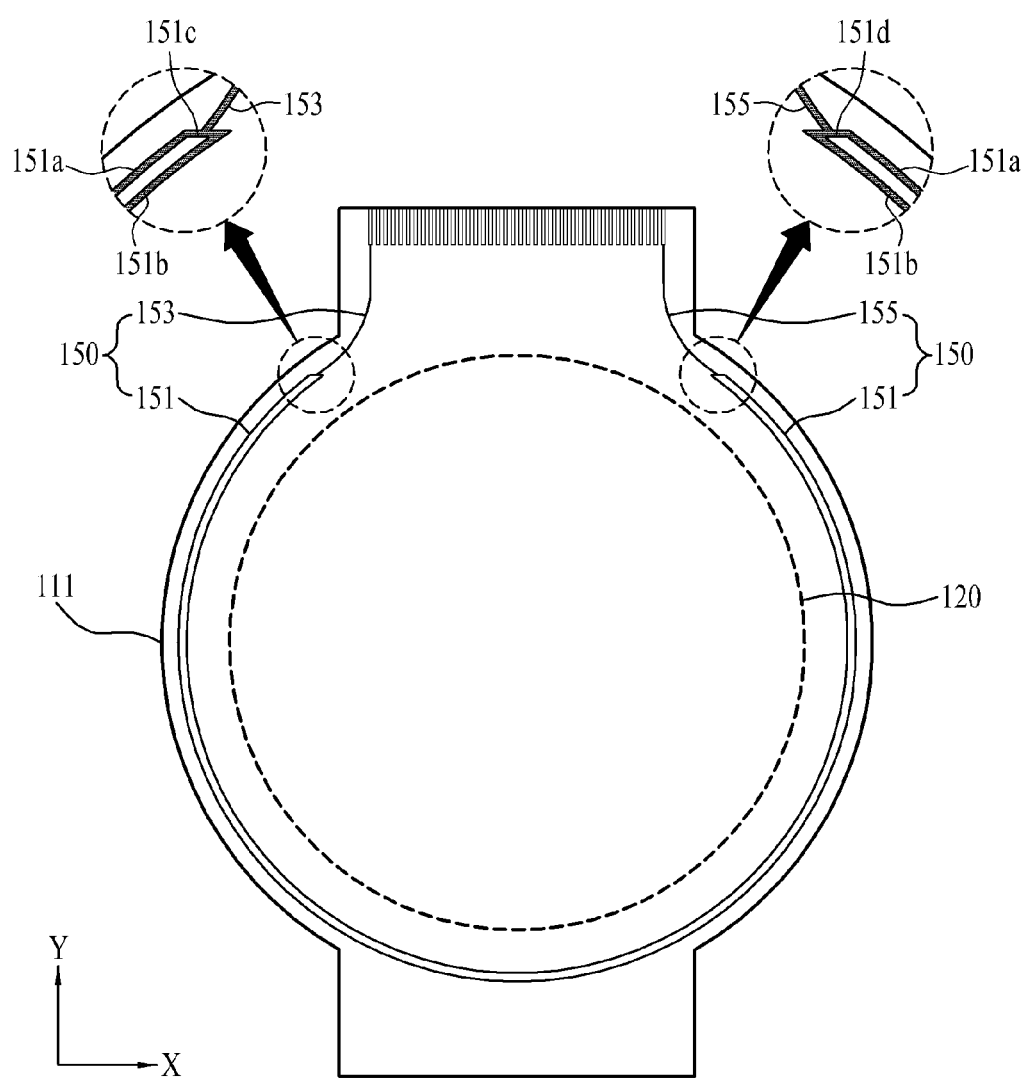
FIG. 8 is a view illustrating another modified example of a driving power supply line shown in FIG. 1.

FIG. 8 is a view illustrating another modified example of a driving power supply line shown in FIG. 1. In FIG. 8, a circumference line of the driving power supply line is formed in a closed loop type. Therefore, in FIG. 8, a repeated description of elements corresponding to the same reference numerals as those of FIG. 1 will be omitted, and the driving power supply line will only be described hereinafter.

As shown in FIG. 8, the driving power supply line 150 may include a circumference line 151, and first and second shoulder lines 153 and 155.

The circumference line 151 is formed in a closed loop type along the circumference of the other circular display portion 120 except one side of the circular display portion 120 adjacent to the driving circuit connecting portion 113. It is preferable that the circumference line 151 is formed in a concentric circle with at least one of an outer sidewall of the substrate 110 and the circular display portion 120. The circumference line 151 according to one example may include a first curve portion 151a, a second curve portion 151b, a first connecting portion 151c, and a second connecting portion 151d.

The first curve portion 151a is formed along the circumference of the other circular display portion 120 except one side of the circular display portion 120 in parallel with the circular display portion 120. At this time, it is preferable that the first curve portion 151a is formed in a concentric circle with at least one of the outside wall of the substrate 110 and the circular display portion 120.

The second curve portion 151b is formed to be spaced apart from the first curve portion 151a at a certain distance while being arranged in parallel with the first curve portion 151a.

The first connecting portion 151c electrically connects one ends of the first and second curve portions 151a and 151b to each other, wherein the one ends of the first and second curve portions 151a and 151b are adjacent to each other. Therefore, the one ends of the first and second curve portions 151a and 151b are connected to each other seamlessly by the first connecting portion 151c.

The second connecting portion 151d electrically connects the other ends of the first and second curve portions 151a and 151b to each other, wherein the other ends of the first and second curve portions 151a and 151b are adjacent to each other. Therefore, the other ends of the first and second curve portions 151a and 151b are connected to each other seamlessly by the second connecting portion 151d.

Each of the first curve portion 151a, the second curve portion 151b, the first connecting portion 151c and the second connecting portion 151d may be formed on the same layer on the substrate 110.

As the one ends of the first and second curve portions 151a and 151b are connected to each other by the first connecting portion 151c and the other ends of the first and second curve portions 151a and 151b are connected to each other by the second connecting portion 151d, the circumference line 151 is formed in a closed-loop type along the circumference of the circular display portion 120.

The first shoulder line 153 is the same as the aforementioned first shoulder line except that the first shoulder line 153 is formed between the first connecting portion 151c of the circumference line 151 and the first driving power pad of the driving pad portion 113a at a certain curvature to connect one end of the circumference line 151 to the first driving power pad.

The second shoulder line 155 is the same as the aforementioned second shoulder line except that the second shoulder line 155 is formed between the second connecting portion 151d of the circumference line 151 and the second driving power pad of the driving pad portion 113a at a certain curvature to connect the other end of the circumference line 151 to the second driving power pad.

In an alternate implementation, the first curve portion 151a and the second curve portion 151b may be formed on different layers on the substrate 110 to overlap with each other without being formed on the same layer on the substrate 110. In this implementation, the first 151a and second 151b curve portions have a same radius and are parallel to each other along an axis passing perpendicularly through the display area. For example, the first curve portion 151a may be formed on the same layer as the data line DL, and the second curve portion 151b may be formed on the same layer as the anode electrode of the organic light emitting diode to overlap the first curve portion 151a. At this time, the first connecting portion 151c electrically connects the one ends of the first and second curve portions 151a and 151b to each other through a first contact hole (not shown), and the second connecting portion 151d electrically connects the other ends of the first and second curve portions 151a and 151b to each other through a second contact hole (not shown). Therefore, according to the present invention, the driving power supply line 150 having a closed loop type may be formed even though the formation area of the driving power supply line 150 is not increased.

As a result, according to the present invention, the pixel driving power source Vdd is supplied to each pixel P by using the driving power supply line 150 including the circumference line 151 of the closed loop type to minimize voltage drop of the pixel driving power source Vdd, whereby picture quality deterioration caused by voltage drop of the pixel driving power source Vdd may be minimized or avoided.

Figure 9:
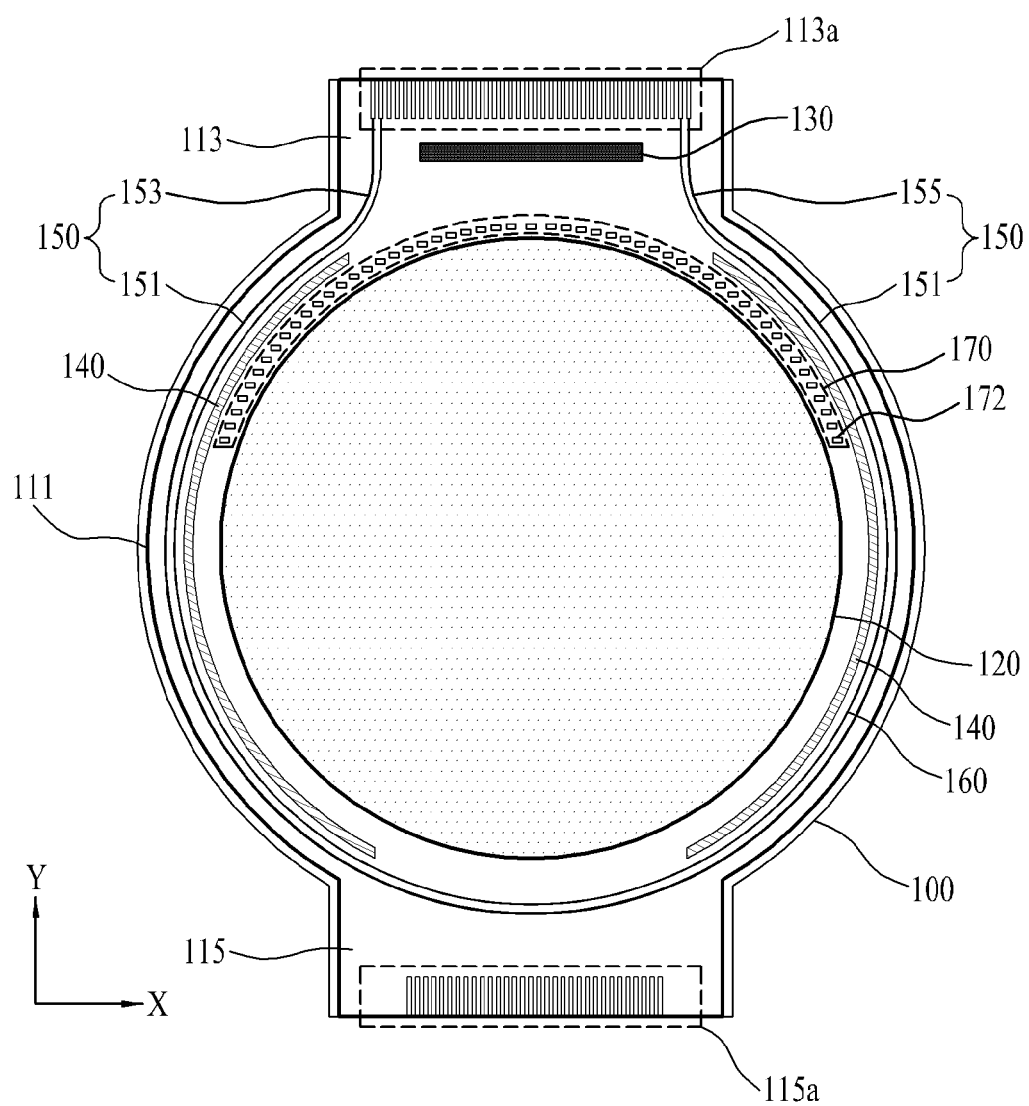
FIG. 9 is a view illustrating a modified example of a display device according to the present invention, which is shown in FIGS. 1 to 8.

FIG. 9 is a view illustrating a modified example of a display device according to the present invention, which is shown in FIGS. 1 to 8. In FIG. 9, a selective portion is additionally provided. Therefore, in FIG. 9, a repeated description of elements corresponding to the same reference numerals as those of FIG. 1 will be omitted, and the selective portion and its related elements will only be described hereinafter.

As shown in FIG. 9, the selective portion 170 includes a plurality of selective circuits 172 formed along the circumference of the circular display portion 120 and connected to two or more data lines DL.

Each of the plurality of selective circuits 172 is connected to a plurality of data groups, each of which includes two or more data lines, one to one, thereby driving the data lines, which are included in each data group, based on time division. Each of the plurality of selective circuits 172 according to one example may be a multiplexing circuit, for example, multiplexer, which has one input terminal and two or more output terminals. A data signal Vdata is supplied from the driving circuit portion 130 to each input terminal of the plurality of selective circuits 172. The output terminals of each of the plurality of selective circuits 172 are connected to the data lines, which are included in each data group, one to one. Each of the plurality of selective circuits 172 supplies the data signal Vdata, which is supplied to the input terminal, to the data lines included in each data group, in due order in response to a time-division selective signal.

Meanwhile, since one unit pixel generally includes red, green and blue pixels, each data group may include three data lines to facilitate driving of the unit pixel. In this case, each of the plurality of selective circuits 172 may have 3i (i is a natural number) output channels (e.g., one for each of red, blue, and green channels), or 4i output channels (e.g., one for each of red, blue, green, and white channels). As a result, it is preferable that the number of data lines included in each data group and the number of output terminals of the selective circuit 172 correspond to the number of pixels constituting one unit pixel or an integer multiple of the number of pixels constituting one unit pixel.

Therefore, according to the present invention, as the number of data link lines is reduced using the selective portion 170, the formation area of the data link lines may be reduced to reduce the length between the first and second circumference points CP1 and CP2, whereby the circular arc portion 111 of the substrate 110 may be formed in a concentric circle with the circular display portion 120. As a result, the bezel width BW of the display device may be more reduced.

Meanwhile, as described above, in the display device according to one embodiment of the present invention, each pixel may be modified to that disclosed in the Korean Laid-Open Patent Nos. 10-2009-0046983, 10-2010-0047505, 10-2011-0057534, 10-2012-0045252, 10-2012-0076215, 10-2013-0066449, 10-2013-0066450, 10-2013-0074147, and the Korean Registered Patent No. 10-0846970 or 10-1073226. In this case, each pixel is connected to the driving power supply line and a reference line. At this time, the driving power supply line is formed in the same structure as that of the aforementioned driving power supply line. The reference line is formed between the cathode power supply line 160 and the circular display portion 120 to have the same structure as that of the aforementioned driving power supply line, whereby the reference line may supply a reference voltage, which is supplied from the display driving portion, to each pixel.

On the other hand, in the display device according to one embodiment of the present invention, each pixel may be modified to that disclosed in the Korean Registered Patent No. 10-0846591 and the Korean Laid-Open Patent Nos. 10-2012-0042084, 10-2012-0069481, and 10-2012-0075828. In this case, each pixel is connected to the driving power supply line and a compensation power line. At this time, the driving power supply line is formed in the same structure as that of the aforementioned driving power supply line. The compensation power line is formed between the cathode power supply line 160 and the circular display portion 120 to have the same structure as that of the aforementioned driving power supply line, whereby the compensation power line may supply a compensation voltage, which is supplied from the display driving portion, to each pixel.

As a result, the structure of the driving power supply line and the connection structure between the driving power supply line and the pixel according to the present invention may equally be applied to the power line supplying the power to the pixel.

As described above, the display device according to the present invention has the following advantages.

First, the display device may have a thin bezel width while having the circular display portion.

Second, picture quality deterioration caused by voltage drop deviation per position of the driving power supply line may be resolved.

Third, reliability deterioration of the pixel, which is caused by water permeation, may be resolved.

Finally, signal interference between the pixel driving power source and the data signal may be avoided.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting diode (OLED) display device comprising:
   a substrate comprising a circular arc portion, a driving circuit connecting portion connected to the top of the circular arc portion, wherein the circular arc portion is substantially circular around a center point;
   a display area formed in the circular arc portion, the display area comprising a circular shape centered around the center point, the display area comprising a plurality of OLED pixels, each OLED pixel connected to one of a plurality of power lines and connected to one of a plurality of data lines;
   a driving power supply line formed in the circular arc portion and configured to provide a driving voltage for the OLED pixels, the driving power supply line comprising a circular shape centered around the center point and formed around the display area, the driving power supply line having a lower area formed on a side of the circular arc portion opposite from the driving circuit connecting portion; and
   a plurality of power sharing lines extending from the lower area of the driving power supply line, each of the power sharing lines connected to a different plurality of the power lines, wherein neither the power lines nor the power sharing lines intersect or cross any of the data lines, and wherein the power lines are parallel to the data lines within the display area.

2. The OLED display device of claim 1, wherein the driving power supply line surrounds an entirety of the display area except for a top of the display area facing the driving circuit connecting portion.

3. The OLED display device of claim 1,
   wherein an initial portion of each power sharing line is formed to extend away from the driving power supply line along a direction parallel to a plurality of scan lines of the OLED pixels.

4. The OLED display device of claim 3,
   wherein the power lines are oriented perpendicularly to the initial portions of the power sharing lines.

5. The OLED display device of claim 1,
   wherein each power sharing line is connected to a different subset of the power lines.

6. The OLED display device of claim 1, wherein each of the power sharing lines connecting to at least one of the power lines.

7. The OLED display device of claim 1, wherein each of the power lines is connected to only one of the power sharing lines.

8. The OLED display device of claim 1, further comprising a plurality of dummy pixels formed in between the pixels of the display area and a circular boundary of the display area.

9. The OLED display device of claim 1, wherein the lower area is within a lower half circle of the circular arc portion.

10. The OLED display device of claim 1, wherein each pixel comprises:
    an OLED comprising an anode and a cathode;
    a driving transistor comprising a gate, a source, and a drain, wherein
       the drain is connected to one of the power lines to receive the driving voltage, and
       the source is connected to the anode of the OLED.

11. The OLED display device of claim 1, comprising a cathode power supply line formed in the circular arc portion between the driving power supply line and the display area, a cathode of each pixel being electrically connected to the cathode power supply line.

12. The OLED display device of claim 11, wherein the cathode power supply line comprises a circular shape centered around the center point.

13. The OLED display device of claim 1, wherein each end of the driving power supply line is connected to an associated driving power pad formed in the driving circuit connecting portion.

14. The OLED display device of claim 13, wherein the circular portion of the driving power supply line is connected at each end to a corresponding shoulder portion of the driving power supply line that extends into the driving circuit connecting portion.

15. The OLED display device of claim 14, wherein the driving power supply line comprises a connection line connecting both ends of the driving power supply line formed underneath a driving circuit formed in the driving circuit connecting portion.

16. The OLED display device of claim 14, wherein the portion of the driving power supply line in the circular arc portion comprises two parallel, concentric lines formed in different layers to overlap each other so that both of the lines have a same radius.

17. An organic light emitting diode (OLED) display device comprising:
    a substrate comprising a driving circuit connecting portion formed on top of a circular portion;
    a display area formed in the circular portion and comprising a plurality of OLED pixels arranged in a circular shape, each OLED pixel physically connected to one of a plurality of power lines and physically connected to one of a plurality data lines;
    a driving circuit formed in the driving circuit connecting portion, the driving circuit electrically connected to the data lines and wherein a portion of each data line extends downwards towards its associated physically connected OLED pixels;
    a driving voltage pad formed in the driving circuit connecting portion, the driving voltage pad physically connected to a driving power supply line that extends downward and surrounds the OLED pixels;
    wherein each of the power lines is electrically coupled to the driving power supply line and extends upwards towards its associated physically connected OLED pixels; and
    wherein the power lines do not intersect or cross any of the data lines, and wherein the power lines are parallel to the data lines within the display area.

18. The OLED display device of claim 17,
    wherein the portion of each data line extending downwards towards its associated physically connected OLED pixels extends downward away from the driving circuit connecting portion;
    wherein the driving power supply line that extends downward and surrounds the OLED pixels extends downward away from the driving circuit connecting portion; and
    wherein the power lines extending upwards towards their associated physically connected OLED pixels extend upward towards the driving circuit connecting portion.

19. The OLED display device of claim 17, further comprising:
    a plurality of power sharing lines extending from the lower area of the driving power supply line, each of the power sharing lines connected to a different plurality of the power lines.

20. An organic light emitting diode (OLED) display device comprising:
- a substrate comprising a circular arc portion, a driving circuit connecting portion connected to the top of the circular arc portion, wherein the circular arc portion is substantially circular around a center point;
- a display area formed in the circular arc portion, the display area comprising a circular shape centered around the center point, the display area comprising a plurality of OLED pixels, each OLED pixel connected to one of a plurality of power lines;
- a driving power supply line formed in the circular arc portion and configured to provide a driving voltage for the OLED pixels, the driving power supply line comprising a circular shape centered around the center point and formed around the display area, the driving power supply line having a lower area formed on a side of the circular arc portion opposite from the driving circuit connecting portion, wherein each end of the driving power supply line are connected to a driving power pad formed in the driving circuit connecting portion; and
- a plurality of power sharing lines extending from the lower area of the driving power supply line, each of the power sharing lines connected to a different plurality of the power lines.

21. The OLED display device of claim 1, further comprising a driving circuit formed in the driving circuit connecting portion, the driving circuit electrically connected to the data lines and wherein a portion of each data line extends downwards towards its associated OLED pixels.

* * * * *